United States Patent [19]
Pennington et al.

[11] Patent Number: 5,619,080
[45] Date of Patent: Apr. 8, 1997

[54] LINE FILTER FOR REDUCING AC HARMONICS

[75] Inventors: Donald G. Pennington, La Grange Park; Paul Holzer, Schaumburg, both of Ill.

[73] Assignee: Power & Ground Systems Corporation, Willowbrook, Ill.

[21] Appl. No.: 552,346

[22] Filed: Nov. 2, 1995

[51] Int. Cl.⁶ ................................. H02J 3/01; H02M 1/10
[52] U.S. Cl. ........................... 307/105; 333/176; 333/177
[58] Field of Search ............ 307/105, 17; 333/167–177; 363/39; 334/40, 41, 45

[56] References Cited

U.S. PATENT DOCUMENTS

| | | | |
|---|---|---|---|
| 2,835,872 | 5/1958 | Pierce | 333/176 |
| 3,073,988 | 1/1963 | Adler | 333/175 |
| 4,328,474 | 5/1982 | Goodman et al. | 333/176 |
| 5,323,304 | 6/1994 | Woodworth | 307/105 |
| 5,387,821 | 2/1995 | Steciuk et al. | 307/105 |

FOREIGN PATENT DOCUMENTS

| | | | |
|---|---|---|---|
| 0001427 | 1/1989 | Japan | 307/105 |
| 0146933 | 6/1990 | Japan | 307/105 |

*Primary Examiner*—Richard T. Elms
*Attorney, Agent, or Firm*—Charles F. Lind

[57] ABSTRACT

The disclosed AC harmonic first circuit utilizes band pass and stop filters that have resonance frequencies close to but yet a few Hz or a small percent away from the harmonic frequencies intended to be attenuated, the difference being comparable to the Q factor of the respective filter. Thus, every circuit filter has a different resonance frequency, and the difference between the filter resonance and harmonic frequencies might be 0.2–5%. Each filter attenuates the energy of each harmonic by possibly 10–50%. A network filter having a resonance frequency corresponding to the AC power network frequency is in series in the hot line between the power network source and the harmonic filter circuit. The circuit uses only passive components in reducing disruptive harmonics from the AC power network.

17 Claims, 1 Drawing Sheet

LINE FILTER FOR REDUCING AC HARMONICS

BACKGROUND OF THE INVENTION

Alternating current (or AC) electrical power can be easily generated and transmitted via distribution conductors or lines, in pure or clean wave form, for energizing many loads or components connected on the lines. The component operation will typically be true and reliable when energized by clean power. When powered by contaminated AC power, the operation of some components can be unreliable.

Of importance to this invention, some components when energized cause feedback signals that differ from the pure AC power, which possibly could return to the power distribution network and contaminate AC power on the entire network, and in turn influence the reliability of operation of other components powered by the same distribution network.

Component generated feedback might typically include harmonic signals of the input power signal. The greatest harmonics problems arise from the odd harmonics, and the greatest problem arise from the lowest or 3rd harmonic, as the higher frequency 5th, 7th, etc. harmonics correspondingly have less current strengths.

Filtering circuits in the power distribution lines can reduce the presence or strength of the harmonic signals. However, the filtering circuit components must absorb the energy of the filtered harmonic signals, which for continuous operation may require making the components of greater size or capacity; and many intended uses may limit the component sizes or weights. Moreover, the filtering circuit could include active components, such as operational amplifiers, or could be comprised of only passive components, such as resisters, inductors, or capacitors. Passive components generally have greater reliability, but also have lesser power capacity; and under sizing or over driving any component could lead to complete circuit failure.

A specific need illustration could involve a commercial passenger aircraft, where a common electrical power network energizes the critical flight and navigational controls as well as the passenger entertainment TV monitors, which create many feedback harmonics. Without effective line filtering circuits, the unchecked feedback harmonics would contaminate the AC power network that could adversely reduce the reliability and even safety of the commonly powered aircraft controls.

SUMMARY OF THE INVENTION

This invention relates to filtering circuit for reducing harmonics signals in an AC power line or distribution network.

A basis object of this invention is to provide an AC harmonics filtering circuit comprised entirely of only passive electrical components.

Another object of this invention is to provide an AC harmonics filtering circuit that can be highly efficient in isolating disruptive harmonic signals from electrical components powered on a common AC power line or distribution network.

A specific feature of this invention is providing an AC harmonics filtering circuit suited for operation in such a manner that the passive electrical components used therein can be of less overall capacity than the energy of the harmonic signals to be attenuated.

BRIEF DESCRIPTION OF THE DRAWINGS

These and other objects, features or advantages of the invention will be more fully understood and appreciated after consideration of the following disclosure, which includes the accompanying drawings, wherein.

DETAILED DESCRIPTION OF THE INVENTION

Figure 1:
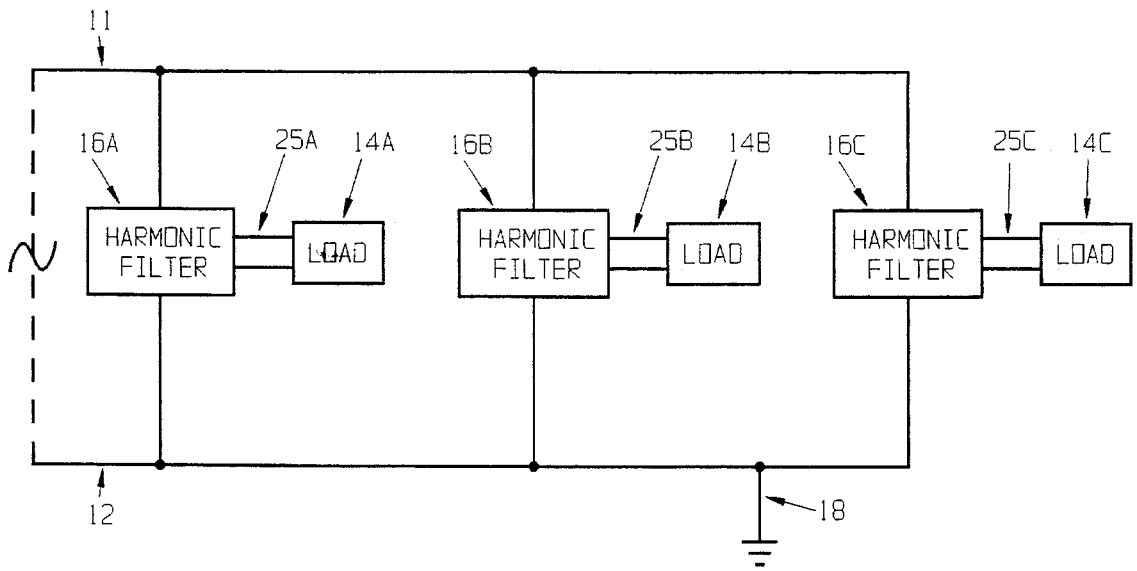
FIG. 1 is a schematic of an AC electric power distribution network illustrating therein line filtering circuits.

The invention disclosed herein is embodied in a generally common power distribution network involving a source of clean AC power at the hot and neutral conductors 11 and 12, and loads 14A, 14B and 14C connected via harmonic filter circuits shown as blocks 16A, 16B and 16C in FIG. 1. However, as the neutral conductor 12 is grounded typically to a suitable chassis ground at 18, it can be considered at the same potential and be identified with the same reference number throughout.

Figure 2:
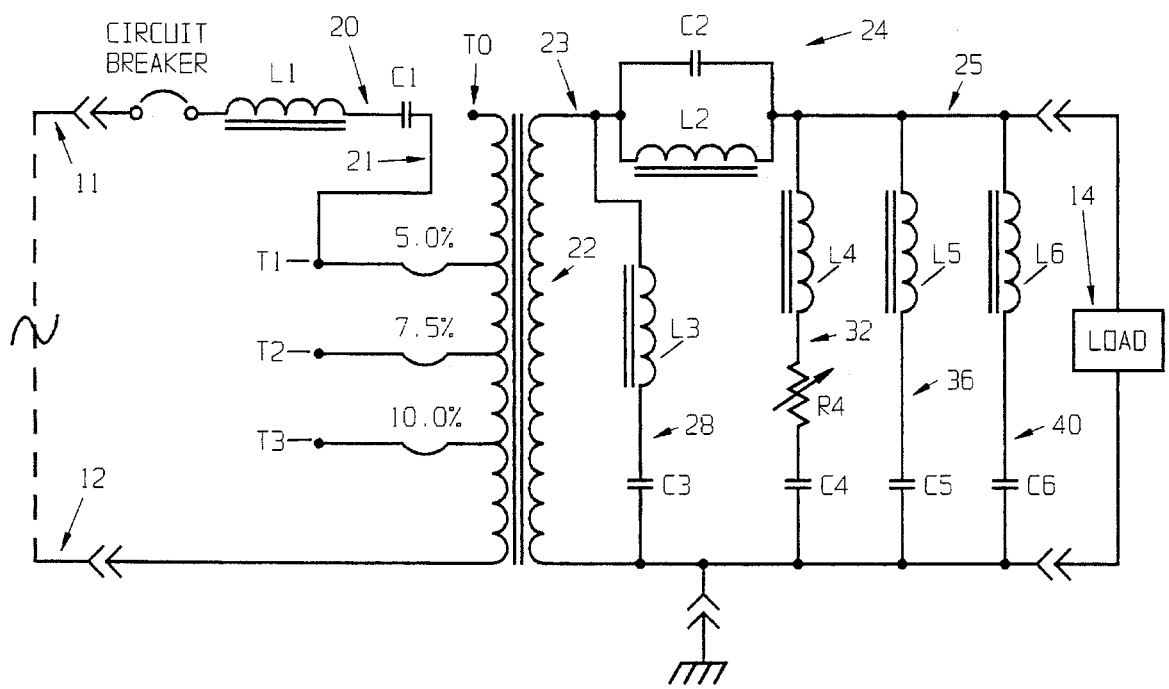
FIG. 2 is a more detailed schematic of the electric power distribution network and line filtering circuit therein.

The proposed filtering circuit for AC harmonics is disclosed in FIG. 2, comprised only of passive components including inductors and capacitors primarily (and an adjustment resistor in one part of the circuit), and thus is of a LC type.

The illustrated LC filtering circuit is comprised as band pass filter 20 formed of serially connected inductor L1 and capacitor C1 connected between the hot line 11 and the hot primary side of transformer 22, and as band stop filter 24 formed of parallelly connected inductor L2 and capacitor C2 connected between the hot secondary side 23 of transformer 22 and hot line 25 (and 25A, 25B and 25C in FIG. 1) at the respective load 14 (and loads 14A, 14B and 14C in FIG. 1).

Band pass filter 28 is connected between the hot secondary side 23 of the transformer 22 and the neutral line 12, the filter 28 being formed of serially connected inductor L3 and capacitor C3. The band pass filter 28 is primarily for attenuating the third harmonic signal.

Three additional band pass filters 32, 36 and 40 are connected between the hot load line 25 (and 25A, 25B and 25C in FIG. 1) and the neutral line 12: band pass filter 32 comprised of serially connected inductor L4, capacitor C4 and adjustable resister R4; band pass filter 36 comprised of serially connected inductor L5 and capacitor C5; and band pass filter 40 comprised of serially connected inductor L6 and capacitor C6.

In the illustrated circuit, hot line terminal tap 21 can be secured to any of taps T0, T1, T2 and T3, each leading to different coil locations along the hot primary side of the transformer 22, whereby a hard connection (shown between taps 21 and T1) effectively would be made between the hot line and the primary side of transformer 22. This selective connection is provided so as to boost as needed the effective voltage of the secondary side of the transformer 22, sufficient to compensate for ohmic based voltage drops across the inductors L1 and L2. Specifically, tap T0 to transformer 22 can provide an effective 1:1 primary-secondary windings ratio, while taps T1, T2 and T3 might effectively vary this so as to boost the secondary side voltages by possibly 5%, 7.5% and 10% respectively compared to primary side AC source voltage.

Each load 14 (or 14A, 14B or 14C) might be generating contaminating signals, including harmonic signals at three, five, seven, nine, etc. times the source AC Hz; and the filtering circuit disclosed herein would be designed to attenuate these harmonic signals.

The band pass filters 28 and 32, and the band stop filter 24 are primarily for attenuating the third harmonic signals; the band pass filter 36 is primarily for attenuating the fifth harmonic signals; and band pass filter 40 is primarily for attenuating the seventh and higher harmonic signals. The band pass filter 20 primarily passes the pure AC power, and would have a resonance frequency the same as this AC frequency.

By contrast and of importance, the resonance frequencies of the filters 24, 28, 32, 36 and 40 would be designed or adjusted to be close to but different from the nearby specific respective third, fifth, seventh, etc. harmonic frequencies of the AC source. The magnitude of the difference between the frequencies might be 0.2–5% away from the exact harmonic frequency, in part depending on the magnitude of the frequencies.

The resonance frequency of each filter 20, 24, 28, 32, 36 and 40 can be exactly determined and/or set, being proportional to the square root of the mathematical product of the inductive reactance of the inductor and the capacitive reactance of the capacitor.

Of importance also, each filter 20, 24, 28, 32, 36 and 40 would be designed to have a Q or quality factor sufficiently large to yield a narrow band width frequency. The filter Q factor is the ratio of the reactive Dower of the reactive components (the inductive or capacitive reactance at the resonance frequency) to the real power dissipated in the resistance in the circuit.

Each filter 24, 28, 32, 36 and 40 specifically would be designed with a Q factor value to yield a band width frequency comparable to the difference between the respective filter resonance frequency and the nearby harmonic frequency to be attenuated. This might be provided by having the filter's frequency response curve, at the half-power points, at or preferably spaced from and beyond the harmonic frequency to be attenuated. A specific example might provide that the difference between the resonance and attenuated frequencies would be approximately between one-half the bandwidth frequency and the bandwidth frequency.

The illustrated LC band pass series filters 20, 28, 32, 36 and 40 would carry maximum current at each's resonance frequency, while the band stop filter 24 would carry minimum current at its resonance frequency.

Should the resonance frequency of the band pass series filters 20, 28, 32, 36 and 40 coincided with the AC or harmonic frequency passing through the filter, the filter capacity must be sufficient to carry all of the energy used in or harmonic signal generated in the load 14. However, with the resonance frequency of the filters 28, 32, 36 and 40 intentionally made slightly different than the harmonic frequency intended to be attenuated, only a portion of the harmonic signal energy is shunted through these filters, by design being perhaps 10–50% of the harmonic energy. Advantageously, each of the illustrated LC filters 28, 32, 36 and 40 can be designed to a smaller capacity, to carry and/or dissipate only this reduced load, compared to carrying the full harmonic energy, and thus can be designed and fabricated to a smaller and lighter scale.

With the resonance frequency of each filter 28, 32, 36 and 40 set close to but different from the problematic harmonic signal to be attenuated, the filter will shunt signals close to and even including some of the harmonic signals, sufficient to reduce the magnitude of the disruptive harmonic signals to an acceptable low level for the intended application.

Because of reduced current capacity demands, passive inductors and capacitors (and resistors) of less complication, cost or size than many active components, such as amplifiers, can be effectively used in the disclosed filtering circuit. This is in contrast to line filtering systems that operate with a filter set to an exact AC harmonic frequency, which must thereupon be capable of dissipating the entire harmonic signal, requiring massive, complicated, or costly filter components or making the use thereof impossible, impractical or unreliable for the intended application.

For attenuating the third harmonic signal, the filters 28 and 32 connected between the hot and neutral lines are separated from one another by filter 24 in the hot line. The resonance frequencies of the filters 28 and 32 will be different, the resonance frequency of filter 32 being slightly further from the true third harmonic of the AC power network than the resonance frequency of filter 28 (and preferably on the same side, either more than or less than the harmonic frequency). The resonance frequency of filter 24 will be different from the resonance frequencies of both filters 28 and 32 and from the AC source frequency, and preferably on the opposite side of the true third harmonic from the resonance frequencies of the filters 28 and 32.

In the third harmonic band pass filter 28, the adjustable resister R4 is provided for tuning the Q range of the filter 32.

The band stop filter 24 would block current flow at its resonance frequency, but would freely pass the AC power frequency and it would have sufficient capacity to carry all of the energy needed for the load 14.

The illustrated line filtering circuit can be used with the AC power source operating at any specific frequency, such as commonly used for land based commercial power distribution networks (60 Hz for the typical U.S. distribution networks, or possibly 50 Hz for many foreign country distribution networks), or possibly 400 Hz for an on-board commercial aircraft power distribution network. By way of example only, the following disclosure will be directed specifically to a 400 Hz AC power source.

With respect to the filter 40 provided herein for the very high or 7th, 9th, etc. harmonic signals, the filter resonance frequency might be set to pass 2700 Hz (approximately 100 Hz or 3.5% away from the 7th harmonic of 2800 Hz). The filter 40 further might have a Q value between possibly 40–60 with an associated band width of approximately 40–60 Hz, about half the difference between the resonance and harmonic frequencies.

The filter 36 provided for the 5th harmonic signals might have a resonance frequency of 2045 Hz (approximately 45 Hz or 2.3% away from the 5th harmonic of 2000 Hz); and such filter might have a Q value of between 65–100 to provide an associated band width of approximately 20–30 Hz, again about half the difference between the shunted resonance and harmonic frequencies.

The filter 32 might have a resonance frequency set at 1160 Hz (approximately 40 Hz or 3.3% away from the 3rd harmonic of 1200 Hz); and such filter might have a Q value of between 40–60 with an associated band width of approximately 15–30 Hz, about half the difference between the filter resonance and harmonic frequencies.

The band stop filter 24 might have its resonance frequency set at 1240 Hz (or approximately 40 Hz or 3.3% away from the 3rd harmonic of 1200 Hz), and will essentially block passage of signals at this frequency. The filter might have a Q value of 110–160 and an associated band width of generally 7–15 Hz, about one-third the difference between the resonance and harmonic frequencies.

The band pass filter 28 might have its resonance frequency set at 1184 Hz (or approximately 16 Hz or 1.3% away from the 3rd harmonic of 1200 Hz); and such filter might have a Q value of approximately 40–60 with an associated band width of approximately 15–30 Hz, about the same as or slightly more than the difference between the shunted and harmonic frequencies.

The band pass filter 20 would have its resonance frequency set at 400 Hz, the frequency of the AC power source, and would freely pass and must withstand the full current draw of the load 14. The filter would further serve as a bidirectional trap against other frequencies.

The disclosed filtering circuit has proven effective in eliminating or sufficiently attenuating unwanted and disruptive harmonics, as set within specific specifications. By way of example, within the parameters of the set specifications, the disclosed filtering circuit achieved almost 95 percent attenuation of unwanted and disruptive harmonics, against versus only approximately 80 percent attenuation achieved by competitively bid and prior art filtering circuits, including those using costly and somewhat sensitive active components.

While a specific embodiment has been illustrated, it will be obvious that minor changes could be made therefrom without departing from the spirit of the invention. Accordingly, the invention is to determined by the scope of the following claims.

What is claimed is:

1. A harmonic filter circuit for connection between hot and neutral power lines of an AC power network and an electrical load, comprising the combination of harmonic filter means separating the hot power line from both the load and the neutral power line, the harmonic filter means having: a band stop filter means of parallelly connected inductor and capacitor means in the hot power line in series with the load, and a pair of band pass filter means each of serially connected inductor and capacitor means connected between the hot power and neutral lines from respective connections with the hot power line on opposite sides of the band stop filter means;

network filter means of serially connected inductor and capacitor means in series in the hot power line with both the harmonic filter means and load; and the band stop filter means and the band pass filter means of the harmonic filter means each having different resonance frequencies, and each of such frequencies being close to but yet several Hz away from any true harmonic of the AC power network, and the network filter means having a resonance frequency generally corresponding to the frequency of the AC power network.

2. An AC harmonic filter circuit according to claim 1, further comprising the combination of the band stop filter means and the band pass filter means of the harmonic filter means each having a Q factor value to yield a band width frequency comparable to the difference between the respective resonance frequency of the filter means and the nearby harmonic frequency to be attenuated.

3. An AC harmonic filter circuit according to claim 1, further comprising the combination of the harmonic filter means being for third harmonics and each of the band stop filter means and the band pass filter means having resonance frequencies several Hz away from the true third harmonic of the AC power network frequency.

4. An AC harmonic filter circuit according to claim 3, further comprising the combination of the band stop filter means and the band pass filter means of the harmonic filter means each having a Q factor value to yield a band width frequency comparable to the difference between the respective resonance frequency of the filter means and the nearby harmonic frequency to be attenuated.

5. An AC harmonic filter circuit according to claim 4, further comprising a transformer between the load and the hot and neutral power lines of an AC power network, the transformer having primary and secondary sides each with hot and neutral ends, and the hot ends of the primary and secondary sides respectively connected to the network filter means and the third harmonic filter means.

6. An AC harmonic filter circuit according to claim 4, further comprising fifth harmonic filter means having serially connected inductor and capacitor means connected between the hot power and neutral lines from respective connections between the third harmonic filter means and the load, and the fifth harmonic filter means having a resonance frequency a few Hz away from the true fifth harmonic of the AC power network frequency.

7. An AC harmonic filter circuit according to claim 6, further comprising seventh harmonic filter means having serially connected inductor and capacitor means connected between the hot power and neutral lines from respective connections between the third harmonic filter means and the load, and the seventh harmonic filter means having a resonance frequency a few Hz away from the true seventh harmonic of the AC power network frequency.

8. An AC harmonic filter circuit according to claim 7, further comprising a transformer between the load and the hot and neutral power lines of an AC power network, the transformer having primary and secondary sides each with hot and neutral ends, and the hot ends of the primary and secondary sides respectively connected to the network filter means and the third harmonic filter means.

9. A harmonic filter circuit for connection between hot and neutral power lines of an AC power network and an electrical load, comprising the combination of third harmonic filter means separating the hot power line from both the load and the neutral power line, the harmonic filter means having: a band stop filter means of parallelly connected inductor and capacitor means in the hot power line in series with the load, and a pair of band pass filter means each of serially connected inductor and capacitor means connected between the hot power and neutral lines from connections with the hot power line on opposite sides of the band stop filter means;

network filter means of serially connected inductor and capacitor means in series with the hot power line and both the harmonic filter means and load; and the band stop filter means and the band pass filter means of the harmonic filter means each having different resonance frequencies, and each of such frequencies being close to but yet different by between 0.2–5% from any true harmonic of the AC power network, and the network filter means having a resonance frequency generally corresponding to the frequency of the AC power network.

10. An AC harmonic filter circuit according to claim 9, further comprising the combination of the band stop filter means and the band pass filter means of the harmonic filter means each having a Q factor value to yield a band width frequency comparable to the difference between the respective resonance frequency of the filter means and the nearby harmonic frequency to be attenuated.

11. An AC harmonic filter circuit according to claim 10, further comprising the combination of the harmonic filter means being for third harmonics and each of the band stop filter means and the band pass filter means having resonance frequencies between 0.2–5% away from the true third harmonic of the AC power network frequency.

12. An AC harmonic filter circuit according to claim 11, further comprising each of the harmonic filter means generating a frequency response curve having half-power points at or spaced from and beyond the harmonic frequency to be attenuated, providing that the difference between the resonance and attenuated frequencies range approximately between one-half the bandwidth frequency and the bandwidth frequency.

13. An AC harmonic filter circuit according to claim 11, further comprising fifth and seventh harmonic filter means each having inductor and capacitor means connected in series between the hot power and neutral lines from connections between the third harmonic filter means and the load, and the fifth and seventh harmonic filter means having resonance frequencies between 0.2–5% away from the true respective fifth and seventh harmonics of the AC power network frequency.

14. An AC harmonic filter circuit according to claim 13, further comprising a transformer between the load and the hot and neutral power lines of an AC power network, the transformer having primary and secondary sides each with hot and neutral ends, and the hot ends of the primary and secondary sides connected between the network filter means and the third harmonic filter means.

15. An AC harmonic filter circuit according to claim 12, further comprising the band Pass filter means connected between the network filter means and the band stop filter means having a resonance frequency closer to the third harmonic frequency of the AC power network than the resonance frequency of the band pass filter means connected between the band stop filter means and the load.

16. An AC harmonic filter circuit according to claim 15, further comprising the band stop filter means connected between the network filter means and the load having a resonance frequency different from the resonance frequencies of both band pass filter means and on the opposite side of the true third harmonic from such resonance frequencies.

17. An AC harmonic filter circuit according to claim 16, further comprising fifth and seventh harmonic filter means each having inductor and capacitor means connected in series between the hot power and neutral lines from connections between the third harmonic filter means and the load, and the fifth and seventh harmonic filter means having resonance frequencies between 0.2–5% away from the true respective fifth and seventh harmonics of the AC power network frequency.

* * * * *